(12) United States Patent
Chaji

(10) Patent No.: US 10,312,296 B2
(45) Date of Patent: Jun. 4, 2019

(54) COLOR CONVERSION LAYER INTEGRATION INTO DISPLAY SUBSTRATE WITH HIGH INTENSITY LIGHT SOURCES

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 15/724,319

(22) Filed: Oct. 4, 2017

(65) Prior Publication Data

US 2018/0097037 A1    Apr. 5, 2018

Related U.S. Application Data

(60) Provisional application No. 62/403,742, filed on Oct. 4, 2016.

(51) Int. Cl.
| | |
|---|---|
| *H01L 51/52* | (2006.01) |
| *H01L 27/32* | (2006.01) |
| *G02B 5/20* | (2006.01) |
| *G02F 1/017* | (2006.01) |
| *G09G 3/3225* | (2016.01) |
| *H01L 51/50* | (2006.01) |

(52) U.S. Cl.
CPC ............ *H01L 27/322* (2013.01); *G02B 5/20* (2013.01); *G02F 1/017* (2013.01); *G09G 3/3225* (2013.01); *H01L 27/326* (2013.01); *H01L 27/3244* (2013.01); *H01L 27/3246* (2013.01); *H01L 51/5096* (2013.01); *H01L 51/5203* (2013.01); *H01L 51/5262* (2013.01); *H01L 51/5284* (2013.01); *G02F 2001/01791* (2013.01); *G09G 2300/0452* (2013.01); *G09G 2300/08* (2013.01); *H01L 2251/5307* (2013.01)

(58) Field of Classification Search
CPC ............... H01L 27/322; H01L 51/5096; H01L 51/5203; H01L 51/5262; H01L 2251/5307; G02B 5/20; G02F 1/017
See application file for complete search history.

(56) References Cited

U.S. PATENT DOCUMENTS

| | | | |
|---|---|---|---|
| 7,703,945 B2 * | 4/2010 | Leung ................ | F21V 7/0008 257/98 |
| 8,750,671 B1 * | 6/2014 | Kelly ................... | F21V 3/049 362/335 |
| 2001/0000622 A1 * | 5/2001 | Reeh .................. | C09K 11/7718 257/98 |
| 2001/0033135 A1 * | 10/2001 | Duggal ................ | B82Y 20/00 313/506 |
| 2002/0063517 A1 * | 5/2002 | Hosokawa ........... | H01L 27/322 313/504 |
| 2005/0084775 A1 * | 4/2005 | Kawaguchi .......... | G02B 5/201 430/7 |

(Continued)

OTHER PUBLICATIONS

International Search Report and Written Opinion for International Application No. PCT/IB2017/056098, dated Jan. 15, 2018 (12 pages).

*Primary Examiner* — Donald L Raleigh
(74) *Attorney, Agent, or Firm* — Nixon Peabody LLP

(57) ABSTRACT

The disclosure is related to arranging integrating color conversion layer into a pixel structure by distributing the light output of the light source, and using an attenuator to reduce the hot spot effect caused by high light intensity light at a direct point of sight.

18 Claims, 16 Drawing Sheets

(56) References Cited

U.S. PATENT DOCUMENTS

| | | | |
|---|---|---|---|
| 2006/0105480 A1* | 5/2006 | Boardman | H01L 33/52 |
| | | | 438/22 |
| 2006/0138453 A1 | 6/2006 | Thompson | |
| 2006/0138941 A1* | 6/2006 | Wittmann | H01L 27/322 |
| | | | 313/504 |
| 2009/0086466 A1* | 4/2009 | Sugita | G02F 1/133615 |
| | | | 362/97.2 |
| 2010/0045175 A1* | 2/2010 | Mathai | H01L 27/3209 |
| | | | 313/504 |
| 2011/0025951 A1* | 2/2011 | Jones | H01L 33/50 |
| | | | 349/70 |
| 2014/0063846 A1* | 3/2014 | Lu | G02B 6/0031 |
| | | | 362/609 |
| 2014/0167599 A1 | 6/2014 | Sugiura | |
| 2014/0362579 A1* | 12/2014 | Noh | G02B 3/0056 |
| | | | 362/284 |
| 2015/0124188 A1* | 5/2015 | Kadowaki | G02F 1/133553 |
| | | | 349/42 |
| 2015/0160394 A1* | 6/2015 | Nakano | G02B 6/001 |
| | | | 349/65 |
| 2016/0155882 A1 | 6/2016 | Tian | |
| 2017/0023828 A1* | 1/2017 | Lee | G02F 1/133608 |
| 2018/0059484 A1* | 3/2018 | Murai | G02F 1/133606 |

* cited by examiner

COLOR CONVERSION LAYER INTEGRATION INTO DISPLAY SUBSTRATE WITH HIGH INTENSITY LIGHT SOURCES

CROSS-REFERENCE TO RELATED APPLICATION(S)

This application claims priority to and the benefit of U.S. Provisional Patent Application Ser. No. 62/403,742, filed Oct. 4, 2016, which is hereby incorporated by reference herein in its entirety.

TECHNICAL FIELD

The present disclosure relates to the reduction in the high stress points and direct lines of sight between a light source and a color conversion layer, such as quantum dots (QD), in an optical substrate system for pixels in color displays.

BACKGROUND

One method of creating a color display is to use color conversion material with a high energy light source. In some structures, the size of the color source is significantly smaller than the pixel size. As a result, the light generated by the light source is very high. For example, if the size of the pixel is Ap and the size of light source is Al, the light generated by the light source should be Ap/Al*L where L is the pixel required light. For example, if the pixel size is 100×100 um² and the light source is 10×10 um², the light generated by the light source is at least 100× more than required for the pixel. Generally, the color conversion layers can degrade under such high direct light condition, i.e. a hot spot.

An object of the present invention is to overcome the shortcomings of the prior art by reducing the hot spot effect by distributing the light across the pixels using light distributing structures between the light source and the color conversion layer.

SUMMARY OF THE INVENTION

Accordingly, the present invention relates to a pixel structure comprising: a light source for generating light; a light conversion layer for converting the light to a desired color; and a light distribution structure for distributing the light from the light source onto the conversion layer.

In one embodiment, other layers can be also integrated between the light distributor layer and light source. Also, other layers can be integrated after the light conversion, e.g. QD, layers.

In another embodiment, to avoid high stress points in the light conversion layer caused by high intensity light, an attenuator or blocking structure is used to reduce or block the light intensity from a direct line of sight between the light source and the light conversion, e.g. QD, layer.

In one embodiment, the light distributor is comprised of a light guide.

In another embodiment, the light distributor is comprised of reflective layers and a planarization layer.

In another embodiment, the light attenuator structure is also used as the light source electrode.

In another embodiment, the light attenuator structure is part of the light distributor structure reflective layers.

In an embodiment, the reflective layer is used as part of the light source contact.

In an embodiment, the light distribution structure comprises a thick transparent layer on top of the light source.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Embodiments in the present disclosure are related to the integration of a color conversion layer, e.g. QDs, into an optical substrate system, typically used in color displays. The optical substrate may comprise one or more: micro light emitting diodes (LEDs), organic LEDs, sensors, solid state devices, integrated circuits, micro-electro-mechanical systems (MEMS), and other electronic components. The receiving substrate may be, but is not limited to, a printed circuit board (PCB), a thin film transistor backplane, an integrated circuit substrate, or, in one case of optical micro devices, such as LEDs, a component of a display, for example a driving circuitry backplane.

The shape of the light sources used in the embodiments are for illustration purposes and may have different shapes and sizes. The light source devices may have one or more pads on the side that will contact the receiver substrate. The pads may be mechanical, electrical or a combination of both. The one or more pads may be connected to a common electrode or to a row/column of electrodes. The electrodes may be transparent or opaque. The light sources may have different layers. The light sources may be made of different materials, such as organic, inorganic, or combination thereof.

Figure 1:
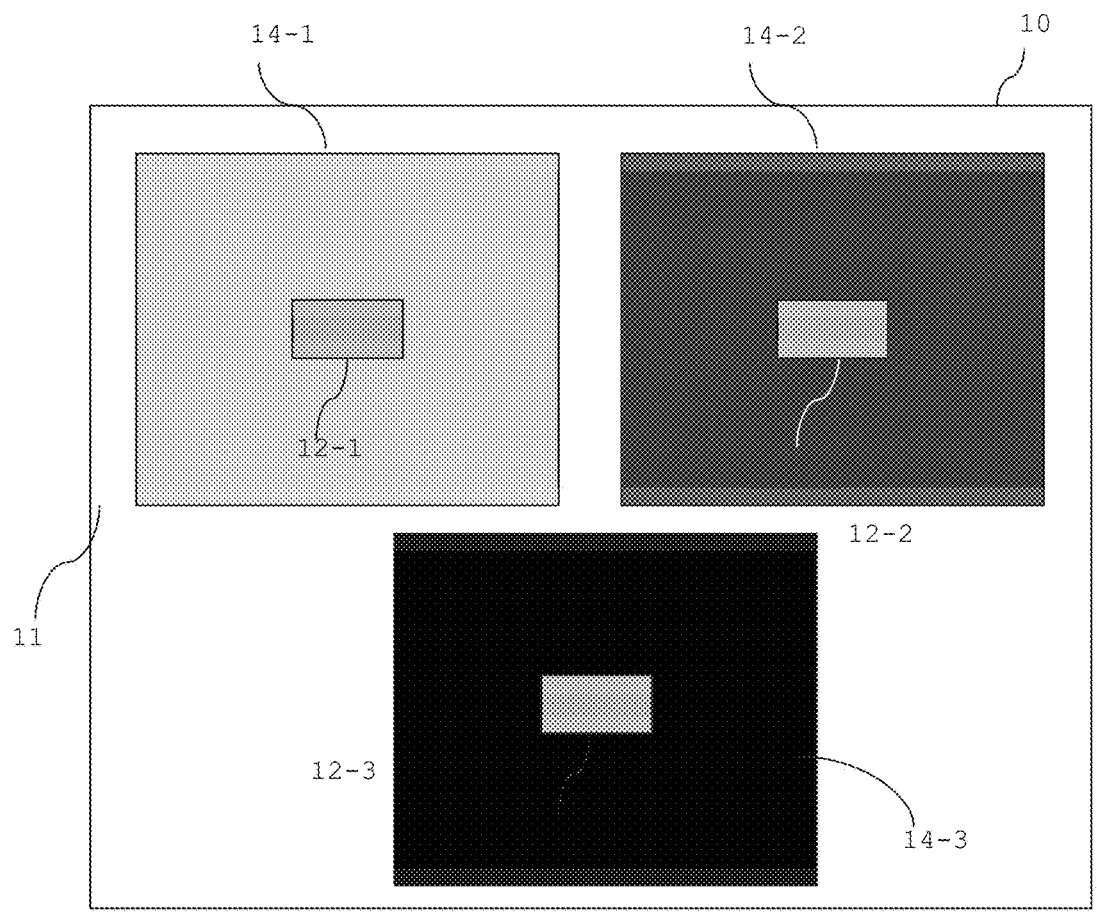
FIG. 1 illustrates an embodiment of a color conversion layer on top of the light source in the pixel.

FIG. 1 illustrates a pixel structure 10 in accordance with an embodiment of the present invention including a substrate 11 with three sub-pixels defined by light sources 12-1, 12-2 and 12-3 mounted thereon with color conversion layers 14-1, 14-2, 14-3, e.g. QD layers, mounted thereover. One of the light sources 14-1, 14-2 and 14-3 may have no color conversion layer. For example, if a blue light source is used, the blue sub-pixel may be without a color conversion layer. Here, other layers may be used on top of the color conversion layers 14-1, 14-2 and 14-3, such as encapsulation, color filter, electrodes for touch interface. The following description may use one sub-pixel 12-1, 12-2 or 12-3 to explain the invention, but the invention may be easily extended to a plurality of sub-pixels, e.g. 2 to 5, and a plurality of pixels for an entire display.

Figure 2A:
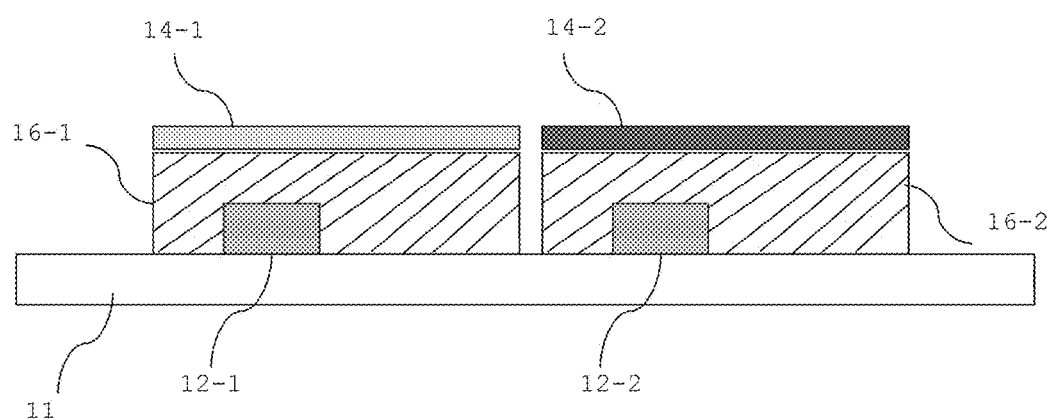
FIG. 2A illustrates an example of implementing a light distribution structure between a light source and a color conversion layer.
Figure 2B:
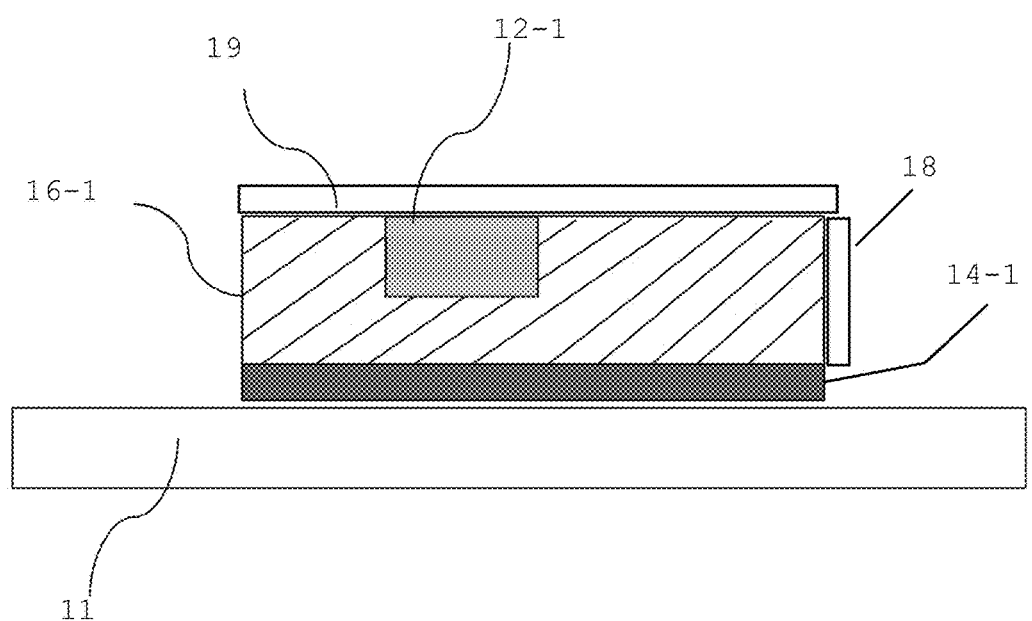
FIG. 2B illustrates another example of implementing a light distribution structure between a light source and a color conversion layer.
Figure 2C:
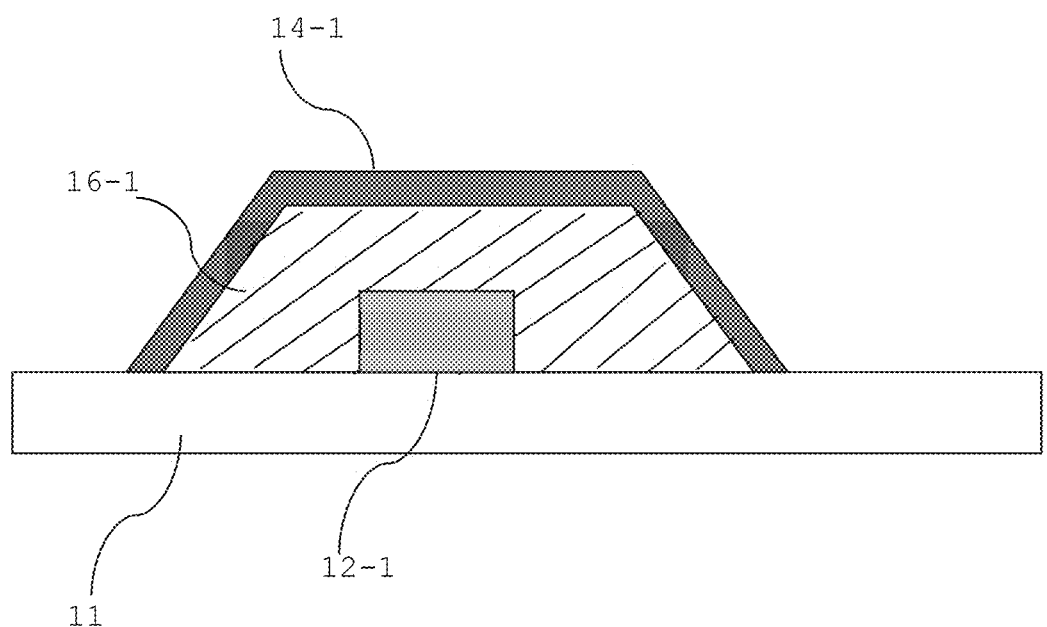
FIG. 2C illustrates another example of implementing a light distribution structure between a light source and a color conversion layer.

FIGS. 2A to 2C illustrate exemplary embodiments of the display substrate 11 that includes the light sources 12-1 and 12-2, and respective light distribution structures 16-1 and 16-2 to distribute the light before reaching the respective color conversion layers 14-1 and 14-2. The light distribution structures may comprise transparent polymer materials, such as: methyl methacrylate styrene (MS) resins with low density, low moisture absorption, and good moldability; methyl methacrylate butadiene styrene, (MBS) resins with a good balance of transparency, strength and fluidity; and transparent acrylonitrile butadiene styrene (ABS) resins. However, other high refractive index, e.g. >1.5, transparent polymer materials may be used, ideally matching the index of the micro device material.

There may be pixel circuits (not shown) on the substrate 11, which may include thin film transistors (TFTs). There may also be a planarization layer between the pixel circuits and the light sources 12-1 and 12-2. An electrode or electrodes may connect the pixel circuits to the light source 12-1 and 12-2. In one embodiment, FIG. 2A, the light is distributed and directed away from the substrate 11 to where the color conversion layers 14-1 and 14-2 are located. In another embodiment, FIG. 2B, the light is directed toward and through the substrate 11, which comprises a material transparent to the particular wavelengths of the light. In this case, the light conversion layer 14-1 may be located on the substrate 11, with the light distribution structure 16-1 on the light conversion layer 14-1, and between the light source 12-1 and the light conversion layers 14-1. The light conversion layer (or layers) 14-1 may be located on the other side of the substrate 11 opposite the light sources 12-1. There may also be a planarization layer before the light distribution structures 16-1.

Figure 7:
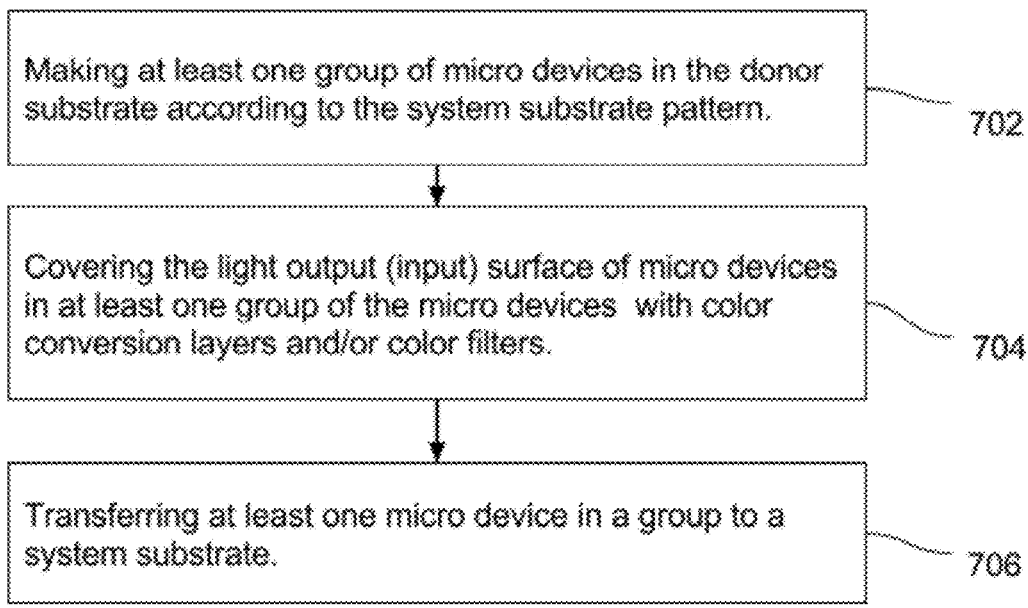
FIG. 7 illustrates a flow diagram for a method in accordance with an embodiment of the present invention.

With reference to FIG. 7, the method of manufacturing the pixel circuit comprises: step 702, e.g. making at least one group of micro devices 12-1 and 12-2 on a donor substrate 11 according to a system substrate pattern; step 704, e.g. covering the light output (input) surface of the micro devices 12-1 and 12-2 with the color conversion layers 14-1 and 14-2 and/or color filters; and step 706, e.g. transferring at least one of the micro devices 12-1 and 12-2 in a group to a system substrate.

The light distribution structure 16-1 may be a thick transparent layer, as hereinabove described. In one example, the layer may be more than 3.mu.m. In another example, the side of the transparent layer may be blocked by an opaque or reflective layer(s) 18 for each pixel or sub-pixel. In another example, there may be reflective layer 19 behind or on top of the light source 12-1.

With reference to FIG. 2C, the sides of the light distribution structure 16-1 may be formed, e.g. etched, at an internal acute angle to the substrate 11 forming a frusto-pyramidal or frusto-conical structure. The acute angle may be between 30° and 60°, preferably between 40° and 50°, enabling light to be directed outwardly from the light source 12-1 at 180°. Similarly, the color conversion layer 14-1 would cover the angled sides and the top of the light distribution structure 16-1.

Figure 3A:
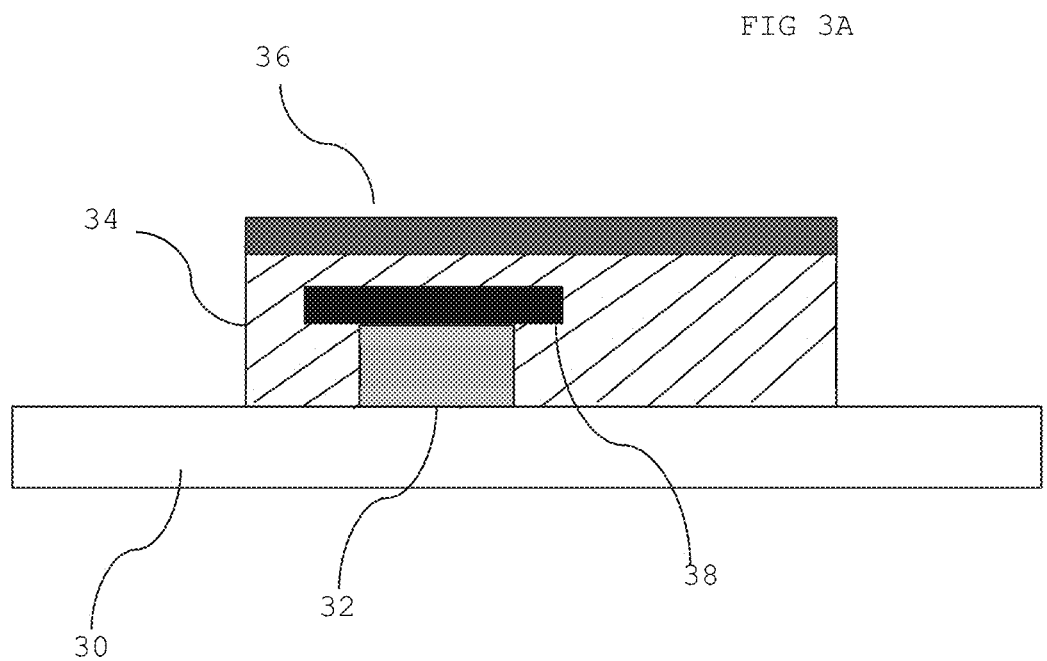
FIG. 3A illustrates an example of implementing a light distribution structure and a light attenuator between a light source and a color conversion layer.
Figure 3B:
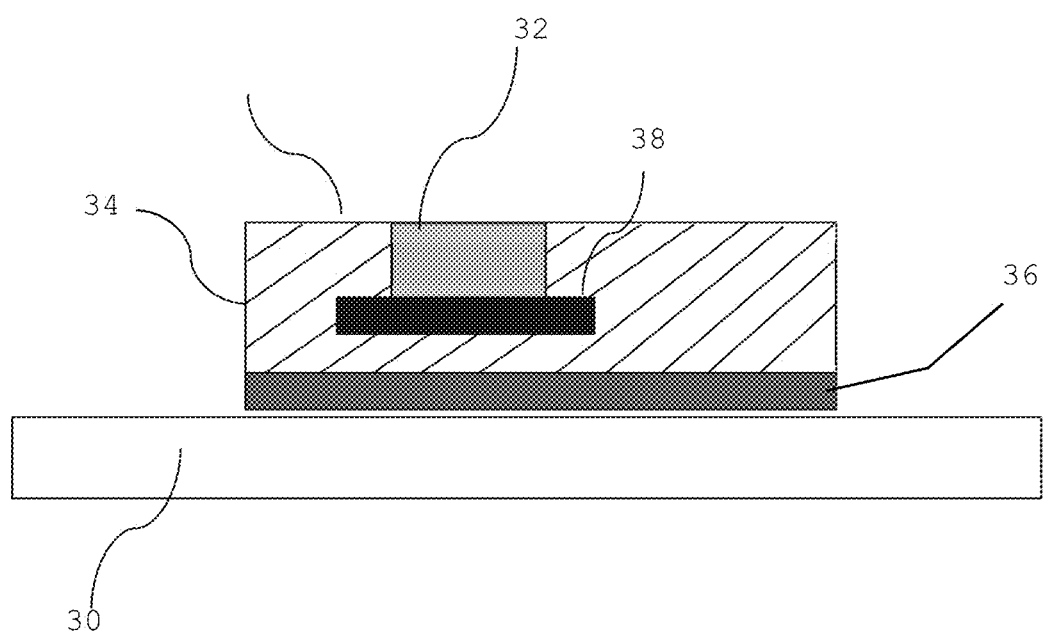
FIG. 3B illustrates another example of implementing a light distribution structure and a light attenuator between a light source and a color conversion layer.

However, the thickness of the light distribution structure 16-1 may be too large, if the ratio of pixel area to light source area is too big. To eliminate the need for a thick light distribution structure 16-1, FIGS. 3A and 3B illustrate embodiments including a light distribution structure 34 with a light attenuator 38 mounted thereon for reducing the hot spot effect. The light attenuator 38 reduces the light intensity from a direct line of sight from a light source 32. In the illustrated embodiment, the attenuator 38 may be comprised of a material opaque to the wavelengths of the light thereby blocking direct light from the light source from hitting the light conversion layer 36. The attenuator structure 38 may act as the contact or electrode of the light source 32. The light attenuator 38 may include at least one of a semi-transparent, an opaque, and a reflective layer. The attenuator 38 may also be an optical structure that redirects the light. The light attenuator 38 may be a part of the light distribution layer 34. The light attenuator structure 38 may be directly on top of the light source 32 or there may be other layers between the light source 32 and the light attenuator structure 38. There may be layers, e.g. of the light distribution structure 34, between light attenuator structure 38 and the light conversion layer 36. The attenuator 38 may be directly on or connected to the light conversion layer 36. Also, the light conversion layer 36 may cover the whole or part of the area over the light attenuator structure 38. FIG. 3B illustrates an alternate embodiment, in which the light source 32 directs the light through the substrate 30, which is transparent to wavelengths in the light, whereby the light conversion layer 36 may be mounted directly on or over the substrate 30, with the light distribution layer 34 and the attenuator 38 mounted between the lighter conversion layer 36 and the light source 32.

Figure 8:
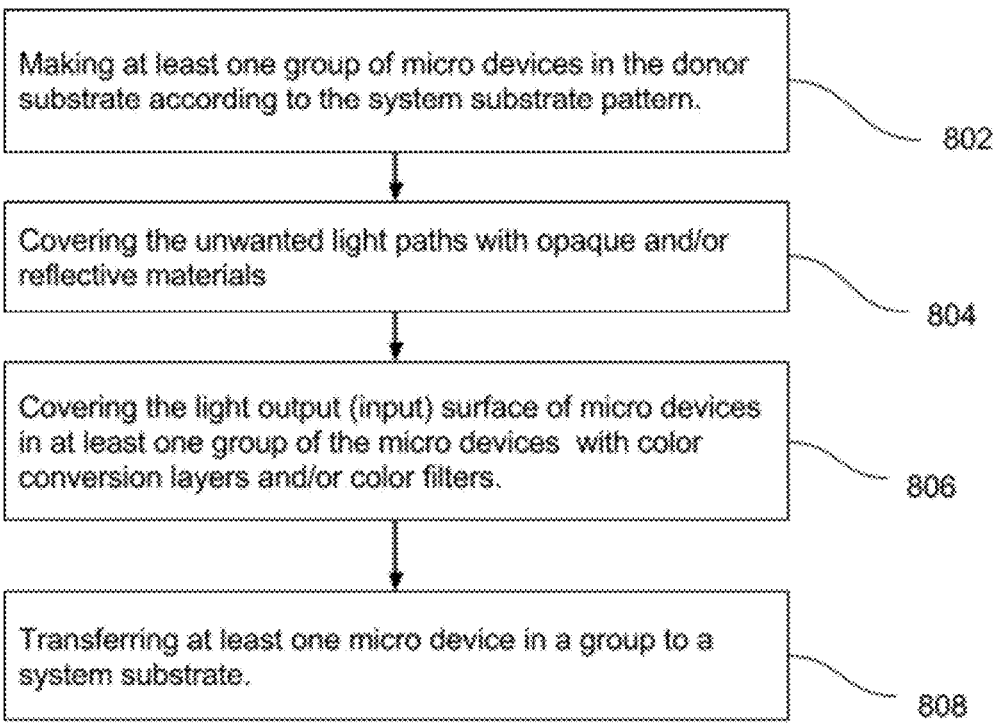
FIG. 8 illustrates a flow diagram for an alternative method in accordance with an embodiment of the present invention.

With reference to FIG. 8, the method of manufacturing the pixel circuit comprises: step 802, e.g. making at least one group of micro devices 32 on a donor substrate 30 according to a system substrate pattern; step 804, e.g. covering or blocking undesired light paths from the micro devices 32 with opaque or reflective materials, e.g. light attenuator 38; step 806, e.g. covering the light output (input) surface of the micro devices 32 with the color conversion layers 36 and/or color filters; and step 808, e.g. transferring at least one of the micro devices 32 in a group to a system substrate.

Figure 4A:
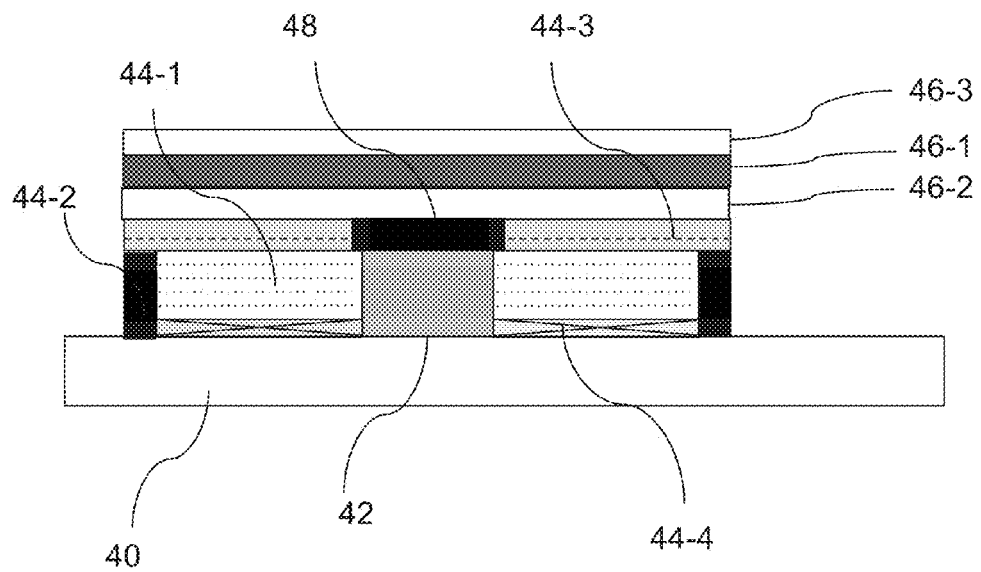
FIG. 4A illustrates a light guide structure to distribute the lights across a pixel.
Figure 4B:
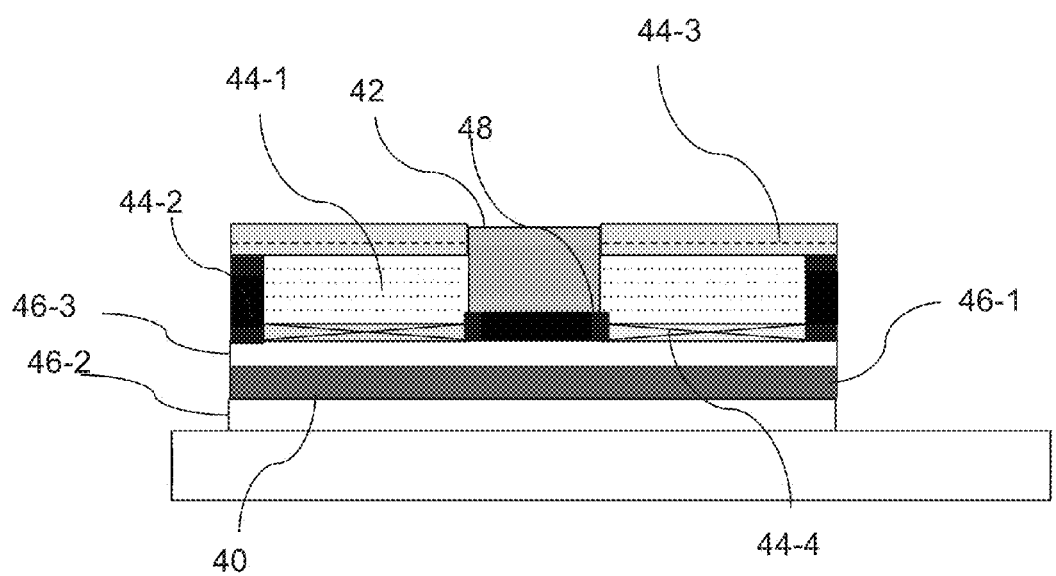
FIG. 4B illustrates another light guide structure to distribute the lights across a pixel.

There are several ways to implement the attenuator structure 38 and/or the light distribution structure 34. FIGS. 4A and 4B illustrate embodiments in which the light is guided to the sides from a light source 42 and either a top layer 44-3 (FIG. 4A) or bottom layer 44-4 (FIG. 4B) of a light distribution structure 44-1 enables the light to pass through. A reflector (or a blocking layer) 44-2 extending along the sides of the light distribution structure 44-1 is used to reflect the light back through the light distribution structure 44-1. The reflector 44-2 may be at an acute angle to the substrate 40 for reflecting the light out through the top 44-3 layer or bottom layer 44-4 of the light distribution structure 44-1. The light pass through the top layer 44-3 (FIG. 4A) or the bottom layer 44-4 (FIG. 4B) and then passes through the light conversion layer 46-1. A attenuator structure 48 mounted on or over the light source 42 is used to reduce hot spots caused by direct line of sight transmission of light from the light source 42. The attenuator structure 48 may also comprise a connection electrode for the light source 42. There can be layers before 46-2 and after 46-3 the light conversion layer 46-1. These layers can have different functionalities. FIG. 4B illustrates an alternate embodiment, in which the light source 42 directs the light through the substrate 40, which is transparent to wavelengths in the light, whereby the light conversion layer 46-1 may be mounted directly on or over the substrate 40, with the light distribution layer 44-1 and/or the attenuator 48 mounted between the lighter conversion layer 46-1 and the light source 42.

Figure 9:
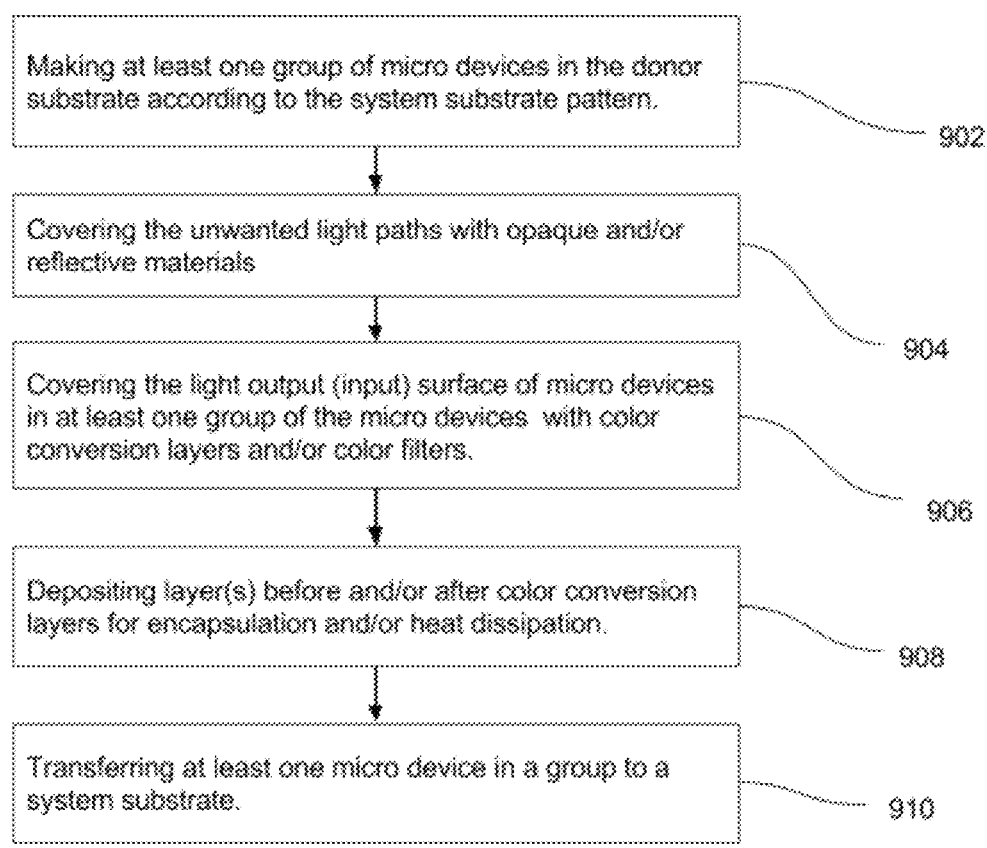
FIG. 9 illustrates a flow diagram for an alternative method in accordance with an embodiment of the present invention.

With reference to FIG. 9, the method of manufacturing the pixel circuit comprises: step 902, e.g. making at least one group of micro devices 42 on a donor substrate 40 according to a system substrate pattern; step 904, e.g. covering or blocking undesired light paths from the micro devices 42 with opaque or reflective materials, e.g. light attenuator 48; step 906, e.g. covering the light output (input) surface of the micro devices 42 with the color conversion layers 46-1 and/or color filters; step 908, depositing layers 46-2 and 46-3 before and/or after the color conversion layers 46-1 for encapsulation and/or heat dissipation; and step 910, e.g. transferring at least one of the micro devices 42 in a group to a system substrate.

Figure 5A:
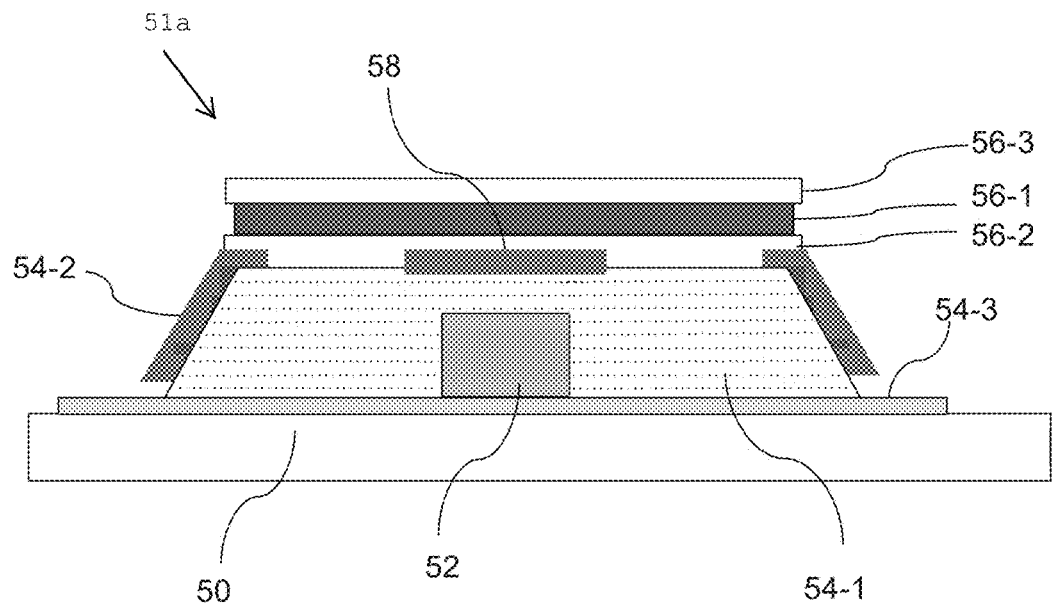
FIG. 5A illustrates a light guide structure with an attenuator for reducing the hotspots effect on the color conversion layer.
Figure 5B:
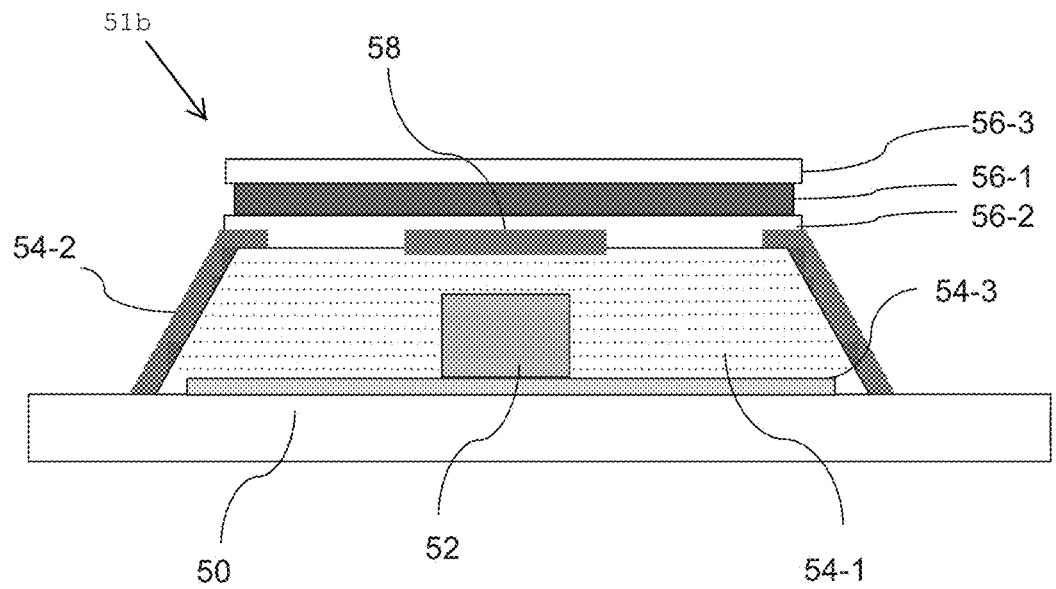
FIG. 5B illustrates another light guide structure with an attenuator for reducing the hotspots effect on the color conversion layer.

Another configuration for a light distribution and a light attenuator structure is demonstrated in FIGS. 5A to 5F. In FIGS. 5A and 5B, a sub-pixel 51 includes a base reflector layer 54-3 mounted on a substrate 50 with a light source 52 mounted thereon. A light distribution layer 54-1 is disposed over the light source 52 and the base reflector layer 54-3. The light distribution layer 54-1 includes sides formed, e.g. etched, at an acute angle, e.g. 30.degree.-60.degree., ideally 40.degree.-50.degree., to the substrate 50 forming a frusto-pyramidal or frusto-conical shape. The angled sides of the light distribution layer 54-1 are then covered, e.g. coated, with angled side reflectors 54-2 at the same angle to the substrate 50. An attenuator 58 is mounted on or over the light source 52 for preventing a direct line of sight from the light source 52 to a light conversion layer 56-1 disposed over the light distribution layer 54-1. Additional layers 56-2 and 56-3 may also be provided. The base reflector 54-3 and the angled side reflectors 54-2 redirect the light from the light source 52, perhaps multiple times, back through the light conversion layer 56-1 and then finally out through the light conversion layer 56-1. The attenuator layer 58 may also act as reflecting layer and reflect the light from the light source 52 toward the base reflector 54-3. The combination of reflectors 54-3, 54-2 and 58 reduces the hot spot problem, i.e. the high light intensity at a direct line of sight from the light source 52 to the light conversion layer 56-1, and distributes the light across the pixel 51. FIG. 5B illustrates an embodiment in which the light distribution layer 54-1 is mounted, e.g. coated, over the entire base reflector 54-3 with the angled side reflectors 54-2 extending down to the substrate 50, in contrast to FIG. 5B, in which the base reflector 54-3 extends the entire width of the pixel 51, whereby the angled side reflectors 54-2 extend proximate to the base reflector 54-3.

Figure 5C:
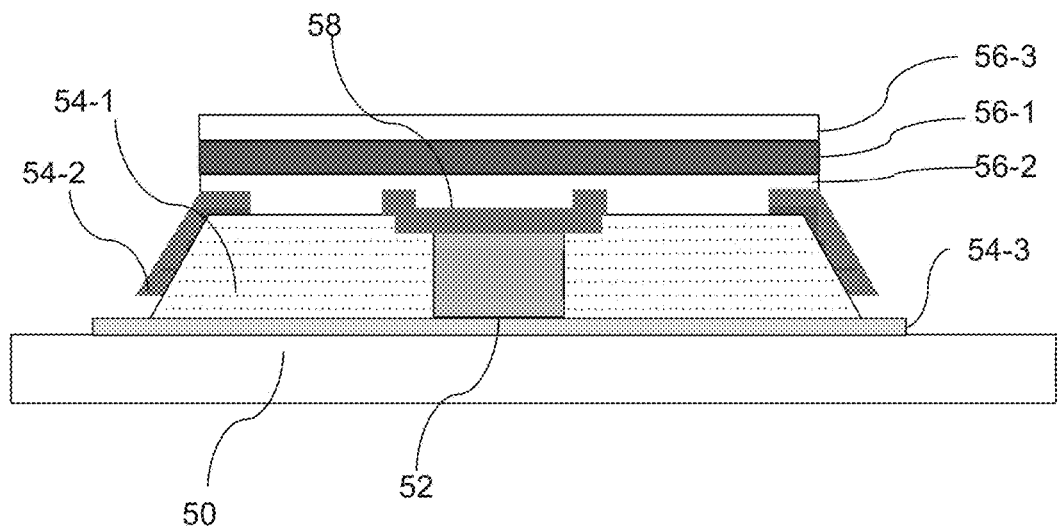
FIG. 5C illustrates another light guide structure with an attenuator for reducing the hotspots effect on the color conversion layer.
Figure 5D:
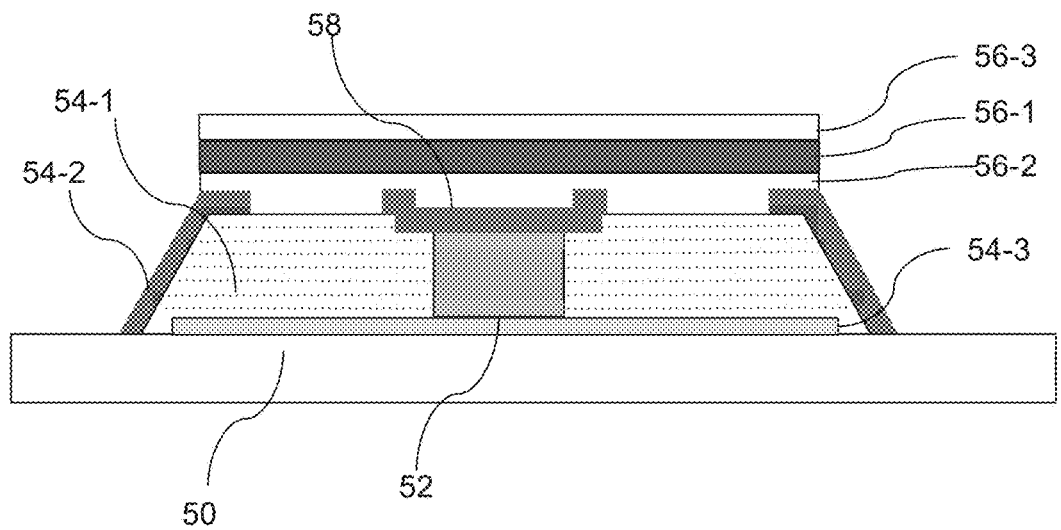
FIG. 5D illustrates another light guide structure with an attenuator for reducing the hotspots effect on the color conversion layer.

FIGS. 5C and 5D are substantially identical to FIGS. 5A and 5B, except that the attenuator 58 is mounted directly on the light source 52, and acts as a contact layer therefor. The contact 58 may be electrical or just mechanical. The contact 58 may be connected to some other structure, e.g. electrical traces or mechanical structure, through a via. The contact 58 may also be connected to the angled side reflectors 54-2 through a patterned trace or through a common electrode. The contact 58 may also be connected to a common electrode. In this case, the common electrode can be deposited on top of the attenuator 58 after a possible dielectric layer with an opening at the attenuator 58. The common electrode may be either patterned into rows or columns or a single layer that connects an array of the pixels 51C or 51D in the display. The base reflector layer 54-3 may be extended beyond the angled side reflector layer 54-2, as hereinbefore discussed. In the case where the base reflector layer 54-3 is not extended beyond the angled side layer 54-2, the angled side layer 54-2 may cover the whole pixel structure 51, as demonstrated in FIGS. 5B and 5D.

Figure 10A:
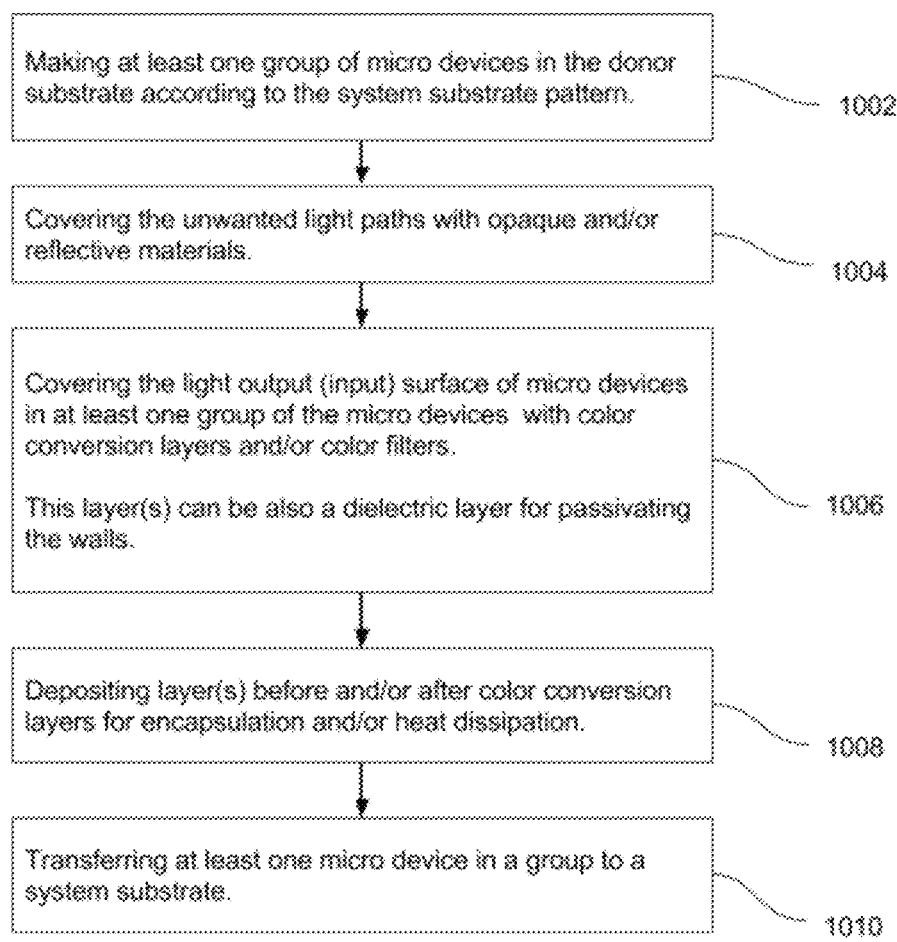
FIG. 10A illustrates a flow diagram for alternative methods in accordance with embodiments of the present invention.

With reference to FIG. 10A, the method of manufacturing the pixel circuit comprises: step 1002, e.g. making at least one group of micro devices 52 on a donor substrate 50 according to a system substrate pattern; step 1004, e.g. covering or blocking undesired light paths from the micro devices 52 with opaque or reflective materials, e.g. light attenuator 58; step 1006, e.g. covering the light output (input) surface of the micro devices 52 with the color conversion layers 56-1 and/or color filters, wherein the color conversion layers may include a dielectric layer for passivation; step 1008, depositing layers 56-2 and 56-3 before and/or after the color conversion layers 56-1 for encapsulation and/or heat dissipation; and step 1010, e.g. transferring at least one of the micro devices 52 in a group to a system substrate.

Figure 5E:
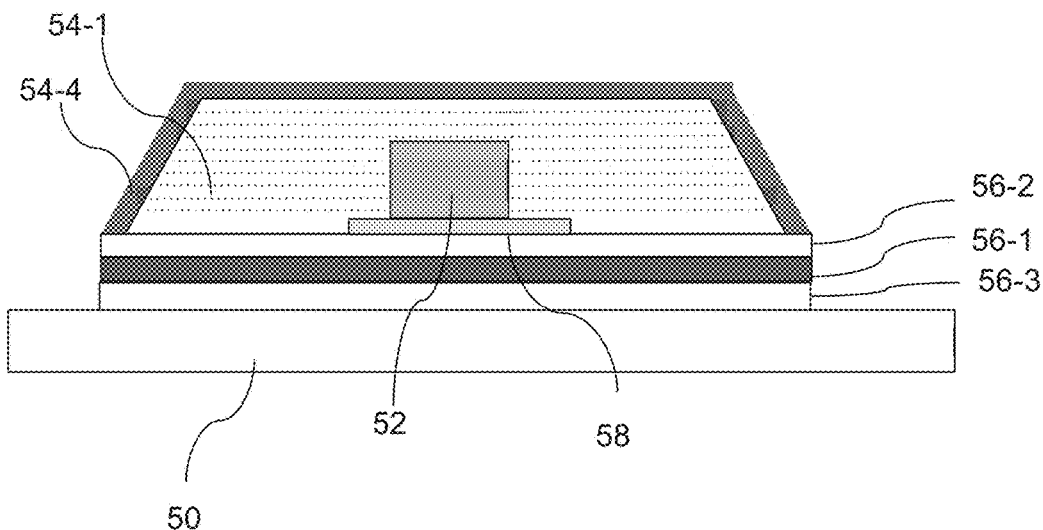
FIG. 5E illustrates another light guide structure with an attenuator for reducing the hotspots effect on the color conversion layer.
Figure 5F:
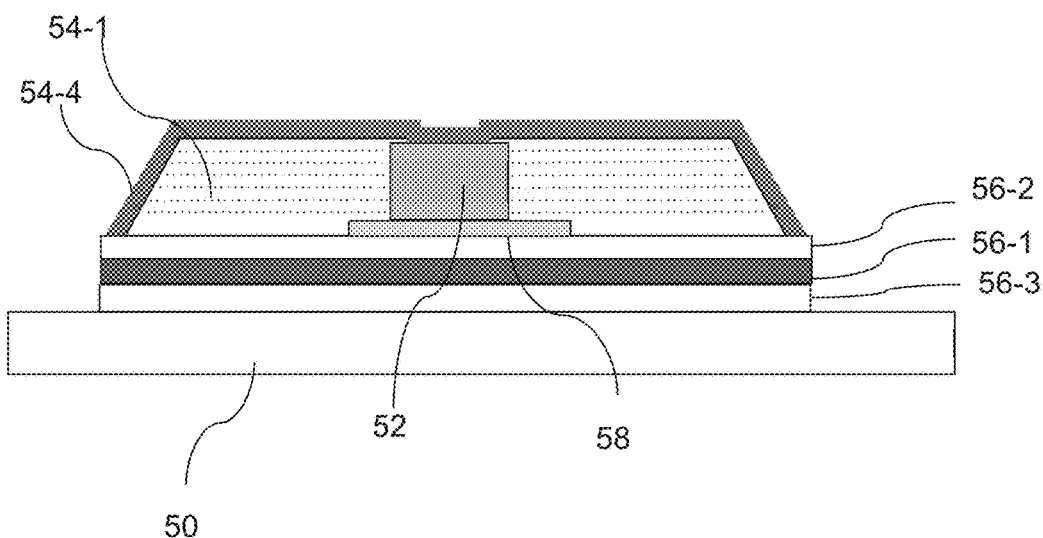
FIG. 5F illustrates another light guide structure with an attenuator for reducing the hotspots effect on the color conversion layer.

In the embodiment illustrated in FIGS. 5E and 5F, the light distribution layer 54-1 is substantially the same as in FIGS. 5A to 5D, but the light conversion layer 56-1 is mounted, e.g. coated, proximate to the substrate 50, whereby the light is directed from the light source 52 through the substrate 50, which is transparent to wavelengths in the light. The attenuator 58 is positioned on or above the light conversion layer 56-1 between the light source 52 and the light conversion layer 56-1. A cover reflector 54-4, e.g. a reflective coating, is disposed over the entire light distribution layer 54-1, including the angled sides, for reflecting the light back toward and through the color conversion layer 56-1, and the substrate 50. There may be layers before 56-2 and after 56-3 the light conversion layer 56-2. In FIG. 5F, at least a portion of the cover reflector 54-2 may contact the light source 52 directly, and act as a contact for the light source 52.

Figure 10B:
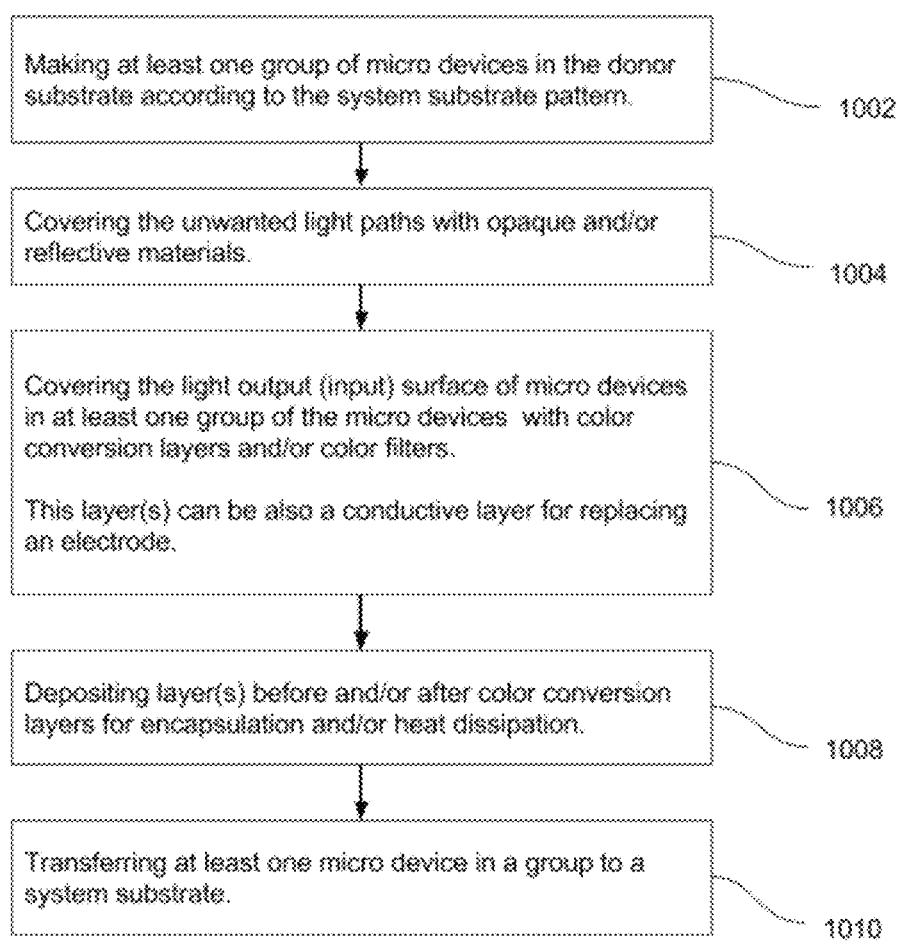
FIG. 10B illustrates a flow diagram for alternative methods in accordance with embodiments of the present invention.

With reference to FIG. 10B, the method of manufacturing the pixel circuit comprises: step 1002, e.g. making at least one group of micro devices 52 on a donor substrate 50 according to a system substrate pattern; step 1004, e.g. covering or blocking undesired light paths from the micro devices 52 with opaque or reflective materials, e.g. light attenuator 58; step 1006, e.g. covering the light output (input) surface of the micro devices 52 with the color conversion layers 56-1 and/or color filters, wherein one of the color conversion layers or the light attenuator 58 may include a conductive layer acting as an electrode for the micro device 52; step 1008, depositing layers 56-2 and 56-3 before and/or after the color conversion layers 56-1 for encapsulation and/or heat dissipation; and step 1010, e.g. transferring at least one of the micro devices 52 in a group to a system substrate.

Figure 6A:
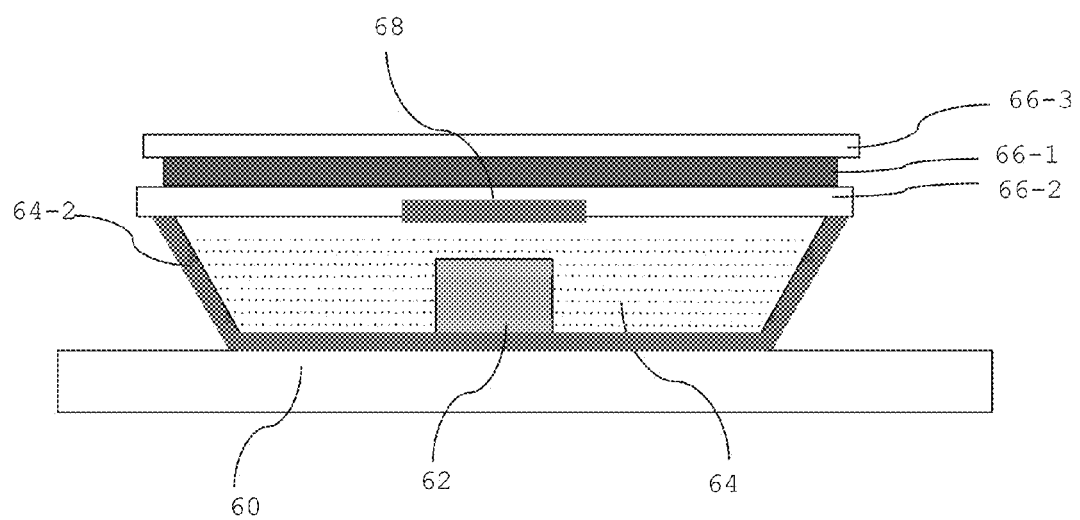
FIG. 6A illustrates another light guide structure with an attenuator for reducing the hotspots effect on the color conversion layer.
Figure 6B:
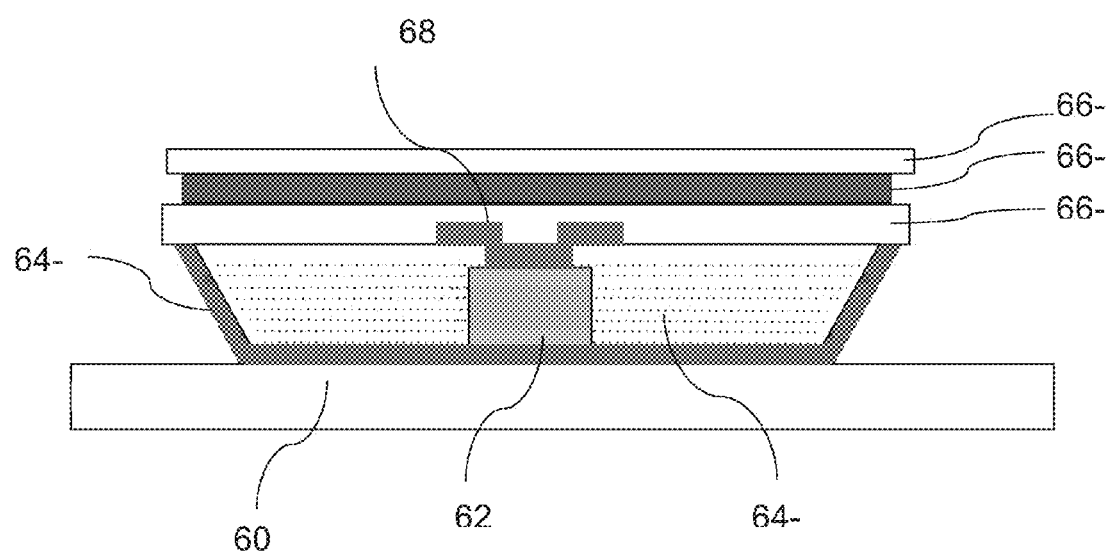
FIG. 6B illustrates another light guide structure with an attenuator for reducing the hotspots effect on the color conversion layer.

FIGS. 6A and 6B illustrate another embodiment of a sub-pixel structure 61 including a light distribution structure 64 with diverging sides in the direction of light transmission formed at an internal obtuse angle to a substrate 60 (acute angle externally). A base reflector layer 64-2, provided on the bottom and angled side surfaces of the light distribution layer 64, also at the same angle as the sides of the light distribution structure 64, reflects the light from a light source 62 away from the substrate 60 and up through a light conversion layer 66-1. A light attenuator 68 mounted over the light source 62, e.g. on a top surface of the light distribution layer 64, eliminates hot spot effects on the light conversion layer 66-1. The embodiment illustrated in FIG. 6B is substantially the same as the one in FIG. 6A, except that the light attenuator structure 68 extends into contact with the light source 62, and thereby may act as a contact for the light source 62 to an external source of electricity.

In all the structures, the conversion layer 66-1 may be deposited over a bank structure 66-2, in which a layer generally organic or dielectric layer is deposited. The bank structure layer 66-2 may be patterned to open the layer in the area where light conversion layer 66-1 will be deposited.

Figure 11:
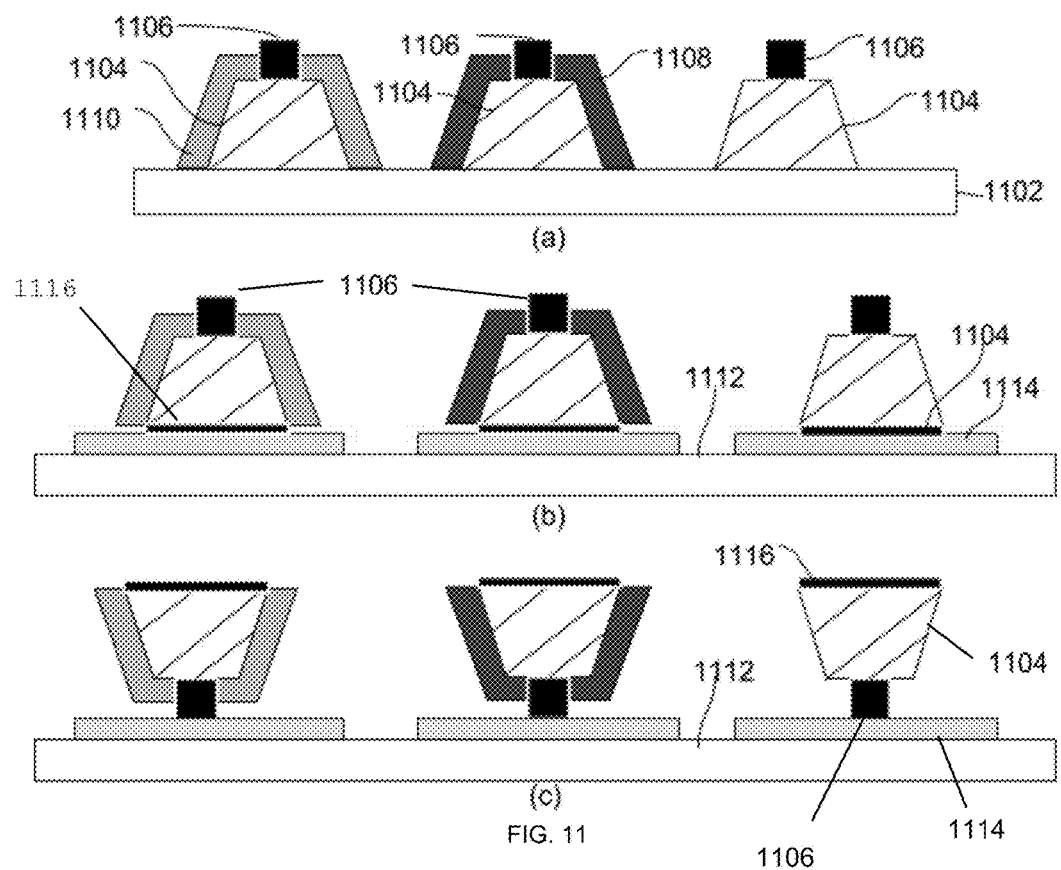
FIG. 11 illustrates various embodiments of the present invention.
Figure 1:
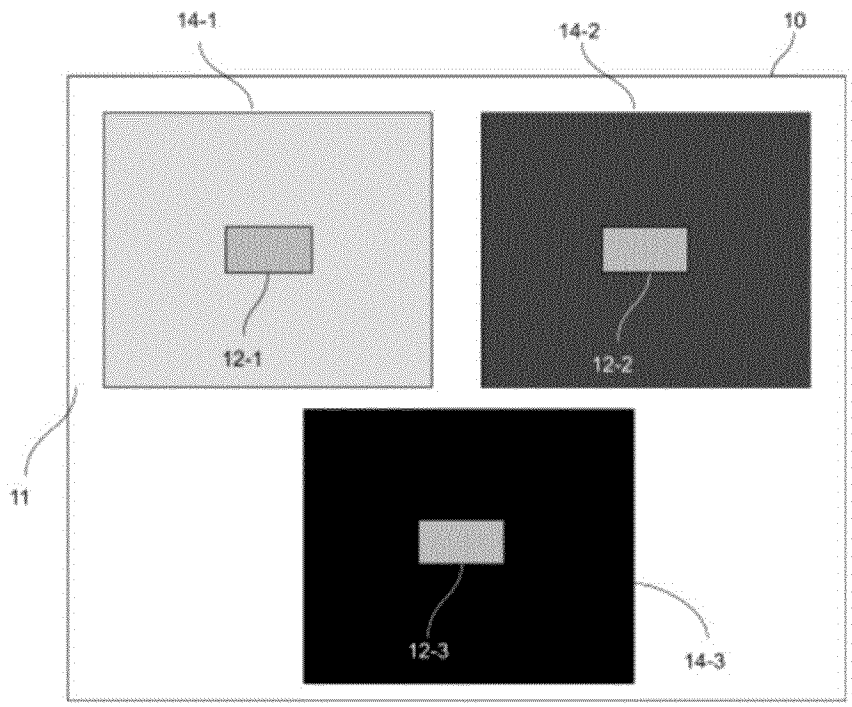
Figure 3B:
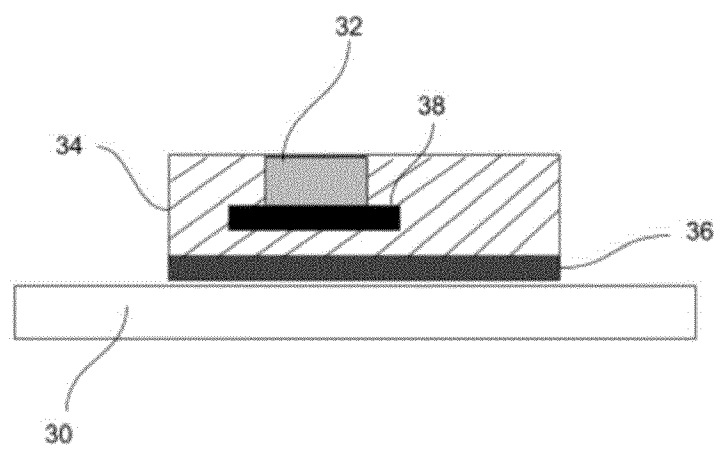
Figure 4B:
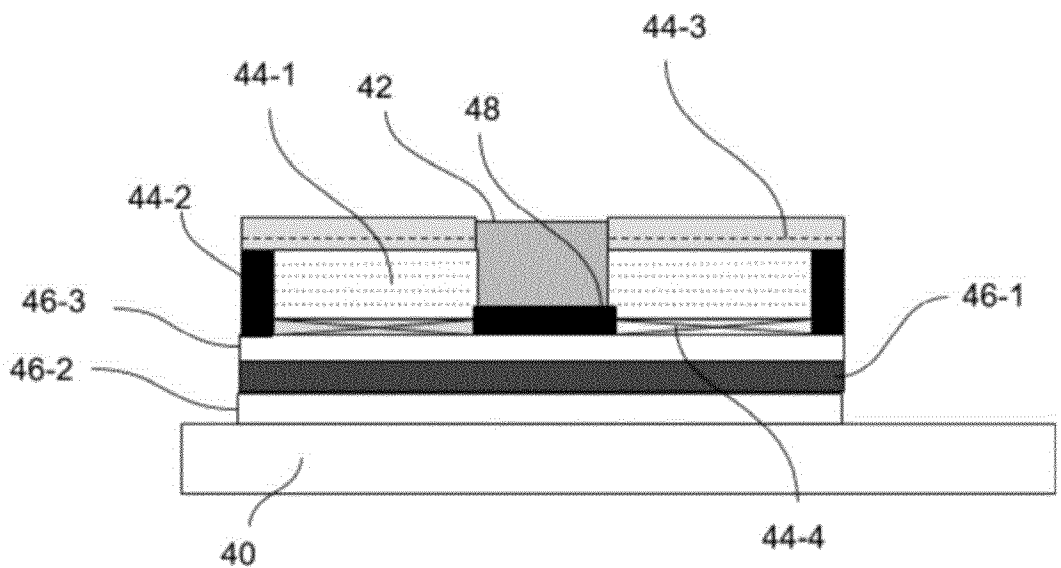
Figure 5C:
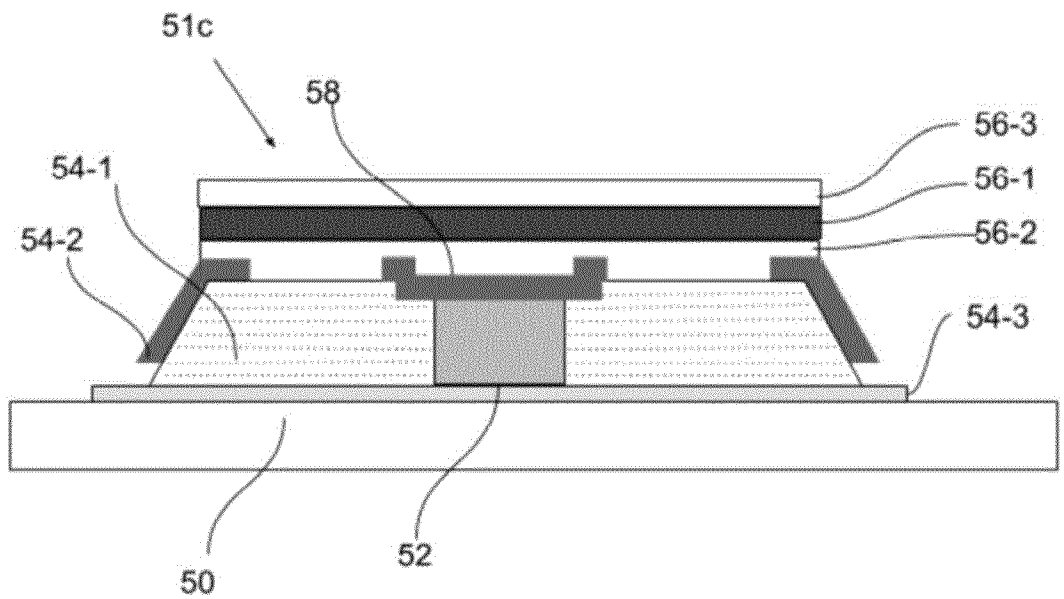
Figure 5D:
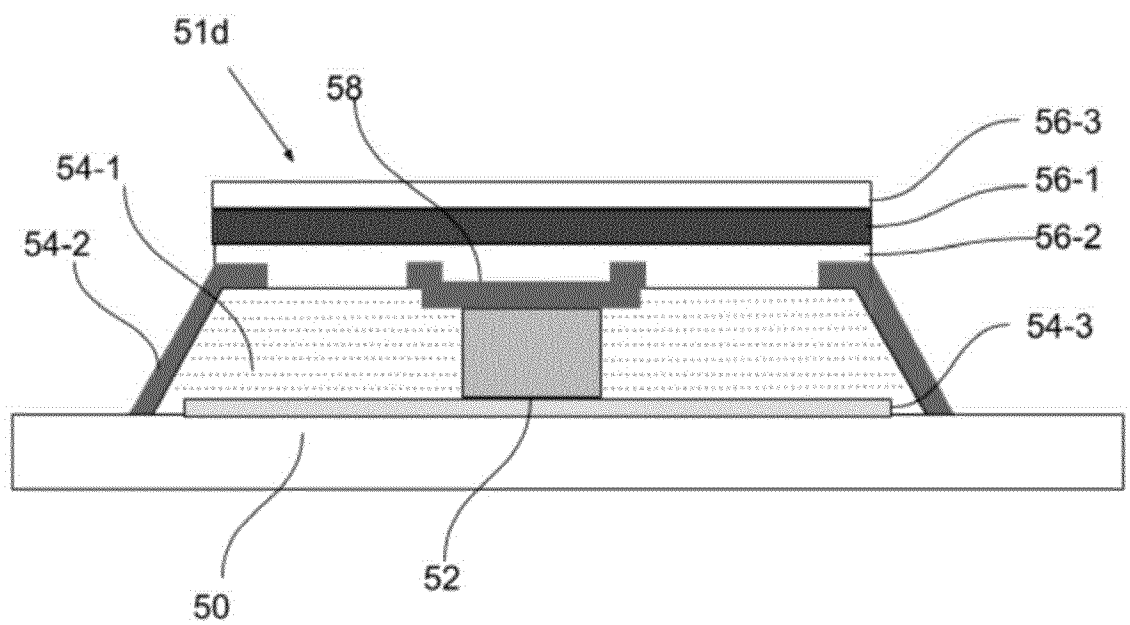
Figure 6A:
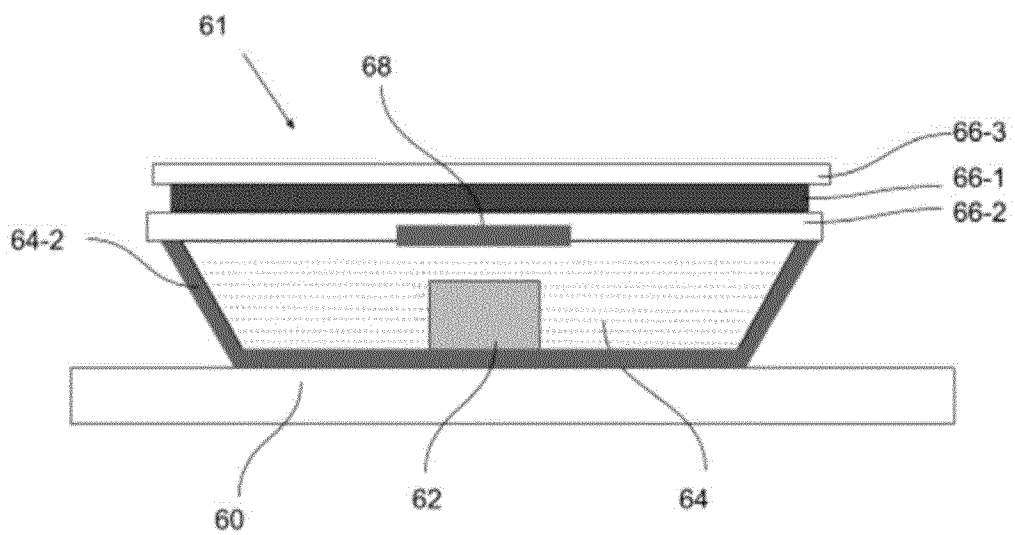
Figure 6B:
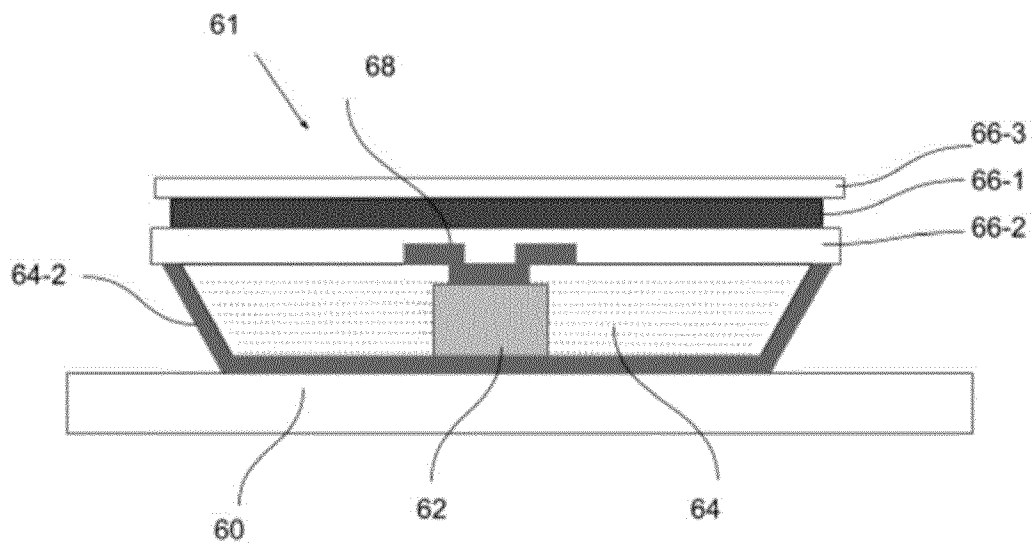

With reference to FIGS. 11a to 11c, the transfer process is illustrated, in which a donor substrate 1102 initially includes three micro devices 1104. Each of the micro device 1104 includes an electrode 1106, which may be transparent, but ideally comprises an opaque or reflective material providing a light attenuator function. The middle micro device 1104 includes, e.g. is coated with, a first color conversion or filter layer 1108 for converting the emitted light from the micro device 1104 into a different color. The left micro device 1104 includes, e.g. is coated with, a second color conversion or filter layer 1110 for converting the emitting light from the micro device 1104 into a third color. Together the three micro devices 1104 may comprise the three different colors, e.g. red, green and blue, required to form a pixel for a display device.

In a first embodiment, the three micro devices 1104 are transferred to a cartridge substrate, and provided with a second electrode 1116 mounted on the opposite end of the micro device 1104 as the electrode 1106. The second electrode 1116 may be comprised of an opaque or reflective material for redirecting any light from the micro device 1104 back through any light distribution material, around any light attenuator structure and through any color conversion layer 1108 or 1110. Each of the micro devices 1104 are then mounted on pads 1114 on a receiver substrate 1112 (FIG. 11b), with the second electrode 1116 in electrical contact with the pad 114.

Alternatively, as illustrated in FIG. 11c, the three micro devices 1104 may be directly transferred to the receiver substrate 1112 with the electrode 1106 in contact with the pads 1114. In this embodiment, the receiver substrate 1112 and the pads 1114 may be transparent to the light emitted from the micro devices 1104 and any subsequent conversion.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A pixel structure for a display comprising:
   a substrate;
   a light source to generate light mounted on or over the substrate;
   a light conversion layer to convert the light to a desired color; and
   a light distribution structure to distribute the light from the light source onto the light conversion layer; and
   a light attenuator structure mounted on or over the light source, wherein the light attenuator structure comprises a reflective layer to redirect the light back through the light distribution structure.

2. The pixel structure according to claim 1, wherein the light attenuator structure comprises a material opaque to the light to block direct lines of sight between the light source and the light conversion layer.

3. The pixel structure according to claim 1, further comprising a reflector mounted on one or more sides of the light distribution structure to reflect light back through the light distribution structure, around the light attenuator structure, and through the light conversion layer.

4. The pixel structure according to claim 3, wherein the light distribution structure comprises sides angled at an acute angle to the substrate; and
   wherein the reflector comprises angled portions mounted on the angled sides of the light distribution structure.

5. The pixel structure according to claim 3, wherein the light distribution structure comprises sides angled at an obtuse angle to the substrate; and
   wherein the reflector comprises angled portions mounted on the angled sides of the light distribution structure.

6. The pixel structure according to claim 3, wherein the reflector comprises a contact for the light source to electrically connect the light source to an external source of power.

7. The pixel structure according to claim 1, wherein the light source is mounted over the substrate; wherein the light distribution structure is mounted over the light source; and wherein the light conversion layer is mounted on the light distribution structure.

8. The pixel structure according to claim 7, wherein the light distribution structure includes at least one side at an angle to the substrate; and wherein the light conversion layer extends up each of the angled sides.

9. The pixel structure according to claim 7, further comprising an attenuator mounted between the light source and the light conversion layer.

10. The pixel structure according to claim 1, wherein the light conversion layer is mounted on the substrate; wherein the light distribution structure is mounted over the light conversion layer; and wherein the light source is mounted on the light distribution structure.

11. The pixel structure according to claim 10, further comprising an attenuator mounted between the light source and the light conversion layer.

12. The pixel structure according to claim 11, further comprising a reflector over the light distribution structure to reflect light back through the light distribution structure and through the light conversion layer.

13. The pixel structure according to claim 12, wherein the light distribution structure includes at least one side at an angle to the substrate; and wherein the reflector extends up each of the angled sides.

14. The pixel structure according to claim 1, wherein the light conversion layer comprises quantum dots.

15. The pixel structure according to claim 1, wherein the light distribution structure comprises a transparent polymer material, including an index of refraction of greater than 1.5, surrounding the light source.

16. The pixel structure according to claim 1, wherein the light attenuator structure comprises an electrode mounted on the light source to couple the light source to an external power source.

17. A pixel structure for a display comprising:
a substrate;
a light source to generate light mounted on or over the substrate;
a light conversion layer to convert the light to a desired color;
a light distribution structure to distribute the light from the light source onto the light conversion layer; and
a reflector between the substrate and the light source to reflect light back through the light distribution structure and through the light conversion layer.

18. The pixel structure according to claim 17, wherein the light distribution structure includes at least one side at an angle to the substrate; and wherein the reflector extends up each of the angled sides.

* * * * *

UNITED STATES PATENT AND TRADEMARK OFFICE
CERTIFICATE OF CORRECTION

PATENT NO. : 10,312,296 B2  
APPLICATION NO. : 15/724319  
DATED : June 4, 2019  
INVENTOR(S) : Gholamreza Chaji It is certified that error appears in the above-identified patent and that said Letters Patent is hereby corrected as shown below:

In the Drawings

Sheet 1, FIG. 1, the reference numeral 12-2 and 12-3 should be applied to the light sources of color conversion layers 14-2 and 14-3, respectively.

Please replace FIGS. 1,3B,4B,5C,5D,6A, and FIG.6B with FIGS. 1,3B,4B,5C,5D,6A, and FIG. 6B as shown on the attached pages.

In the Specification

In Column 5, Line 61, delete "51" after -- sub-pixel --.

In Column 6, Line 18, delete "51" and insert -- 51a --.

In Column 6, Line 23, delete "51" and insert -- 51b --.

In Column 6, Line 44, delete "51" after -- pixel structure --.

In Column 7, Line 46, insert --66-3-- after -- dielectric layer --.

In Column 8, Line 8, delete "114" and insert -- 1114 --.

Signed and Sealed this  
Thirty-first Day of December, 2019

Andrei Iancu  
*Director of the United States Patent and Trademark Office*